(12) United States Patent
Choi et al.

(10) Patent No.: US 7,325,174 B2
(45) Date of Patent: Jan. 29, 2008

(54) PRE-PROCESSING APPARATUS USING NONUNIFORM QUANTIZATION OF CHANNEL RELIABILITY VALUE AND LDPC DECODING SYSTEM USING THE SAME

(75) Inventors: Eun-A Choi, Daejon (KR); Nae-Soo Kim, Daejon (KR); Ji-Won Jung, Busan (KR); Sung-Jun Cho, Busan (KR); Tae-Gil Lee, Busan (KR); Sang-Jin Park, Busan (KR); In-Ki Lee, Busan (KR)

(73) Assignee: Electronics and Telecommunications Research Institute (KR)

( * ) Notice: Subject to any disclaimer, the term of this patent is extended or adjusted under 35 U.S.C. 154(b) by 565 days.

(21) Appl. No.: 10/888,167

(22) Filed: Jul. 9, 2004

(65) Prior Publication Data

US 2005/0144543 A1    Jun. 30, 2005

(30) Foreign Application Priority Data

Dec. 26, 2003  (KR)  ...................... 10-2003-0097948
Jun. 8, 2004   (KR)  ...................... 10-2004-0041836

(51) Int. Cl.
*G06F 11/00*  (2006.01)
(52) U.S. Cl. .................................. 714/704; 375/240.03
(58) Field of Classification Search ................ 714/704; 375/240.03
See application file for complete search history.

(56) References Cited

U.S. PATENT DOCUMENTS 3,786,506 A * 1/1974 Effinger et al. ............... 342/92
4,782,489 A * 11/1988 Moulsley ..................... 714/746
6,954,507 B2 * 10/2005 Bohnhoff et al. ............ 375/341

OTHER PUBLICATIONS

"Iterative Decoding Algorithms Updating Likelihood and Channel Values Based on Interim Hard Decision Resuts", ISIT 2000, Sorrento, Italy, Jun. 25-30, 2000, pp. 174.
Establishment of Optimal Parameters for Implementing the LDPC Decoder, Abstract Collection of 2003 Summer Workshop, Jul. 10-12, 2003.
Establishment of Optimal Parameters for Implementing the LDPC Decoder, The 8th International Conference on Cellular and Intelligent Communications, Oct. 28-31, 2003.

* cited by examiner

*Primary Examiner*—Jacques Louis-Jacques
*Assistant Examiner*—Sam Rizk
(74) *Attorney, Agent, or Firm*—Blakely, Sokoloff, Taylor & Zafman

(57) ABSTRACT

The present invention relates to a pre-processing apparatus using nonuniform quantization of a channel reliability value and a low density parity check (LDPC) decoding system. The pre-processing apparatus can present degradation in performance and be embodied simply by performing decoding pre-process by estimating a discrete channel reliability value ($L_c^*$) through nonuniform quantization of a channel reliability value based on a relations between a bit error rate (BER) estimated through a simulation performed in advance and a standard deviation ($\sigma$) of channel noise within a predetermined range of noise estimation error and p, and bit-shifting a receiving signal as much as a discrete channel reliability value. The pre-processing apparatus includes: a channel reliability measuring unit, a nonuniform quantizing unit, a sign bit adding unit, a bit shifting unit.

4 Claims, 8 Drawing Sheets

| SECTOR | LSB |
|--------|-----|
| 1 | $r_y - r_x$ |
| 2 | $r_x + r_y$ |
| 3 | $r_x - r_y$ |
| 4 | $-(r_y + r_x)$ |

BPSK

8PSK $\sigma^*/\sigma$
<Eb/No = 0dB>

FIG. 6
| σ | σ* | x | $L_c$ | $L_c^*$ |
|---|---|---|---|---|
| 1.1319~1.414 | 1.414 | 0.8~1 | ~1.99 | 1 |
| 0.83~1.15 | 1 | 0.83~1.15 | 2~2.89 | 2 |
| 0.615~0.829 | 0.707 | 0.83~1.15 | 2.96~5.27 | 4 |
FIG. 7
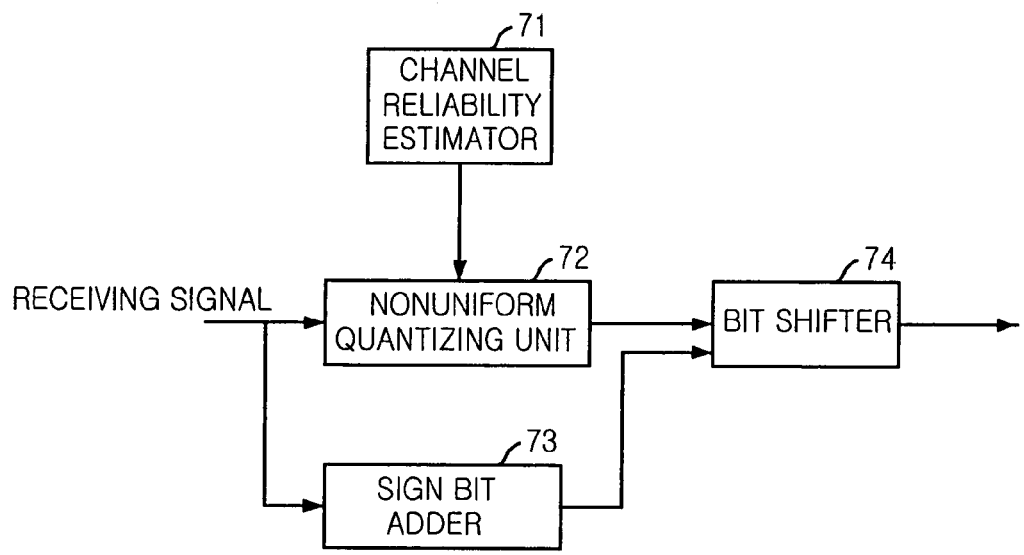
FIG. 8A
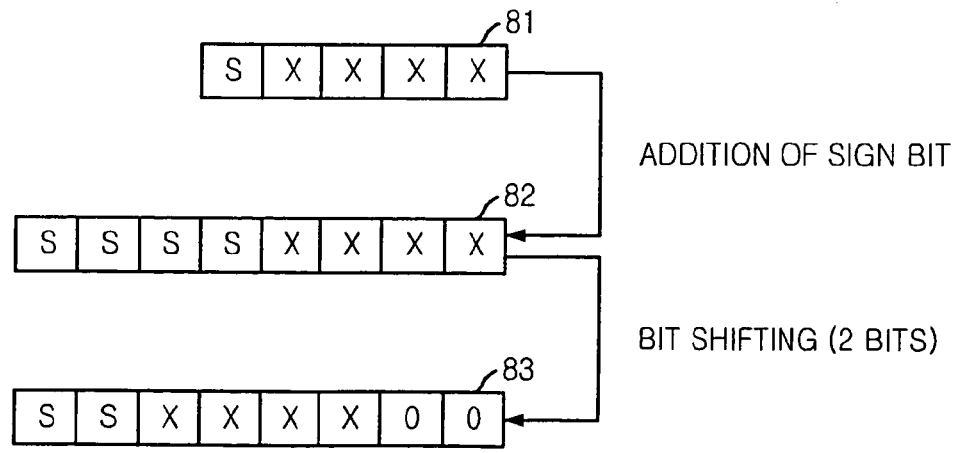

FIG. 10

| ENCODING RATE | DISCRETE CHANNEL RELIABILITY VALUE |
|---|---|
| 1/2 | 2 |
| 2/3 | 4 |
| 3/4 | 5 |
| 4/5 | 5 |
| 5/6 | 6 |
| 7/8 | 7 |
| 8/9 | 7,8 |
| 9/10 | 7,8 |

PRE-PROCESSING APPARATUS USING NONUNIFORM QUANTIZATION OF CHANNEL RELIABILITY VALUE AND LDPC DECODING SYSTEM USING THE SAME

FIELD OF THE INVENTION

The present invention relates to a pre-processing apparatus using nonuniform quantization of a channel reliability value and a low density parity check (LDPC) decoding system; and more particularly to a pre-processing apparatus using nonuniform quantization of a channel reliability value, the apparatus that can present degradation in performance and be embodied simply by performing decoding pre-process, and a low density parity check (LDPC) decoding system.

The pre-process is performed by estimating a discrete channel reliability value ($L_c^*$) through nonuniform quantization of a channel reliability value based on a relations between a bit error rate (BER) estimated through a simulation performed in advance and a standard deviation ($\sigma$) of channel noise within a predetermined range of noise estimation error and p, and bit-shifting a receiving signal as much as a discrete channel reliability value.

DESCRIPTION OF RELATED ART

Recently, a demand for wireless frequency resources is increasing continuously. As technologies using a ultra high frequency band are developed, the application of Ku band (from 12.5 GHz to 18 GHz) and Ka band (from 26.5 GHz to 40 GHz) is increasing as well.

In particular, since diverse forms of services are requested, such as high-quality broadcasting services, ultra high-speed multimedia broadcasting services, data broadcasting services and Internet access services, the frequency band of a satellite is heightened up to the Ka band to provide a wideband broadcasting service that accommodates the services.

Advanced digital communication technologies such as multimedia and high-quality digital television (TV) are popularized and the demand for high-quality and highly reliable wideband broadcasting services is increasing more than ever. Furthermore, efficient use of bandwidths is requested as well as wideband communication in a Ka-band and a reliable transmission channel.

However, as quality degradation of transmitting/receiving signals caused by rain fade and nonlinearity emerges as a serious problem, it is required to develop an adaptive transmission technology that can provide a broadcasting service continuously by compensating the loss of signals efficiently.

Meanwhile, to provide multi-channel a high-quality services in satellite broadcasting channels having low reliability, an adaptive error control method that can cope with the conditions of channels actively. As such error correcting method, a turbo code and low density parity check (LDPC) code in close to the limit of a channel capacity of shanon in an actual decoding algorithm draw attentions and methods for designing an adaptive satellite broadcasting system and optimizing it are in need. Since the development of the technology is in the initial state in Korea, researches on a high-speed channel encoding/decoding method for adaptive satellite broadcasting are important for the balanced development of a communication system.

In digital modulation, a signal is transmitted by changing any one or a combination of a phase, amplitude and frequency of a subcarrier into digital data of 0 and 1. A method of transmitting a signal by making a sign correspond to a phase shift is called Phase Shift Keying (PSK).

A basic phase shift modulating method that transmits a signal of two values (0 or 1) to be transmitted by corresponding the two values to two phases of subcarriers, (0 and $\pi$ phases) is called Binary Phase Shift Keying (BPSK).

Differently from the BPSK, a method of collecting two digital signal values 0 and 1, transmitting the two digital signal values by corresponding them to four phases of subcarriers is called Quadrature PSK (QPSK). That is, (0,0) corresponds to a 0 phase, (0,1) to a $\pi/2$ phase, (1,0) to a $\pi$ phase, and (1,1) to a $3\pi/2$ phase. The BPSK is also referred to as binary phase shift modulation and the QPSK is referred to as quadrature phase shift modulation. A QPSK modulated wave can transmit data twice as much as a BPSK modulated wave in the same frequency band and QPSK modulation is widely used for a satellite communication and speech signal transmission.

Meanwhile, 8 phase shift modulation, i.e., 8 PSK, can transmit data three times as much as the BPSK and 16 phase shift modulation, i.e., 16 PSK, can transmit data four times as much as the BPSK.

The present invention will be described with an example of 8 PSK modulation.

First, when In-phase (I) and quadrature-phase (Q) axes coordinates on a signal constellation of receiving M-ary PSK (MPSK) symbols are x and y, respectively. Their coordinate values can be obtained by using a conventional demodulator.

Meanwhile, in 8 BPS, the outputs from an encoder are grouped into three bits each and then transmitted to a demodulator, which is different from BPSK and QPSK. Thus, the demodulator should be able to send three bits for each symbol to a decoder by utilizing receiving I/Q channels.

Therefore, in the method of outputting three bits by utilizing the receiving I/Q channels, a first bit is determined by a sign of the I channel because the first bit is disposed around the Q axis and a second bit is determined by a sign of the Q channel because it is disposed around the I channel. In the present invention, the third bit is determined by dividing the signal constellation into sectors by utilizing the I and Q channel signals to set a bit range of the last sign to −0.5412 to −0.5412.

FIG. 2 is a diagram describing a least significant bit (LSB) allocating method in 8 Phase Shift Keying (PSK) in accordance with an embodiment of the present invention.

A first bit is determined based on whether a value in the right part or the left part with the Q axis in the center, that is, based on a sign of an I channel receiving value. A second bit is determined based on a value in the upper part or the lower part with the I axis in the center, that is, based on a sign of a Q channel receiving value.

In FIG. 2, when the I and Q-axis coordinates of receiving 8 PSK symbols on a signal constellation are x and y respectively, sector 21 means a first quadrant, a second quadrant, a third quadrant, and a fourth quadrant based on the coordinate axes. Also, $r_x$ denotes a x-axis coordinate value of a receiving signal, while $r_y$ denotes a y-axis coordinate value of a receiving signal.

In the first quadrant, if $r_y - r_x > 0$, the Least Significant Bit (LSB) is 1 (LSB=1). If $r_y - r_x < 0$, the LSB is 0 (LSB=0). In the second quadrant, if $r_x + r_y > 0$, the LSB is 1 (LSB=1). If $r_x + r_y < 0$, the LSB is 0 (LSB=0).

In the third quadrant, if $r_x-r_y>0$, the LSB is 1 (LSB=1). If $r_x-r_y<0$, the LSB is 0 (LSB=0). In the fourth quadrant, if $-(r_y+r_x)>0$, the LSB is 1 (LSB=1). If $-(r_y+r_x)<0$, the LSB is 0 (LSB=0).

If the three-bit symbols of 8 PSK are marked on the symbol constellation 23, the result is shown a diagram in the right part of FIG. 2.

FIG. 3 is a diagram showing a difference in determination range according to a modulation method. It shows a determination range of a receiving signal in the BPSK modulation 31 and 8 PSK modulation 32.

Generally, the constellation of a 8 PSK signal is symmetrical and of gray codes. The determination range of a receiving signal in the 8 PSK modulation 32 is a fourth of that of BPSK.

A Log Likeihood Ratio (LLR) of a log domain where LDPC decoding system can be embodied easily in the BPSK is expressed as Equation 1.

$$L_{fn} = \ln\left[\exp\left[\frac{\frac{-1}{4}(r_n+1)^2}{2\sigma^2}\right]\right] - \ln\left[\exp\left[\frac{\frac{-1}{4}(r_n-1)^2}{2\sigma^2}\right]\right] \quad \text{Eq. 1}$$

$$= \left[\frac{\frac{-1}{4}(r_n+1)^2}{2\sigma^2}\right] - \left[\frac{\frac{-1}{4}(r_n-1)^2}{2\sigma^2}\right]$$

$$= \frac{\frac{-1}{4}(r_n^2+2r_n+1)+\frac{1}{4}(r_n^2-2r_n+1)}{2\sigma^2}$$

$$= \frac{-4r_n}{8\sigma^2} = \frac{-r_n}{2\sigma^2}$$

wherein $L_{fn}$ is a value obtained by multiplying a receiving signal by a channel reliability value.

In short, the LLR of 8 PSK is obtained by multiplying an equation of BPSK by a fourth. If the performances of estimating a channel reliability value ($L_c$) based on Equation 1 when a forth is multiplied with respect to a case of BPSK, when none is multiplied, and when a second is multiplied are measured, the result is as shown in FIG. 4.

FIG. 4 is a graph illustrating performance in estimating a channel reliability value based on Equation 1. In the explanatory remarks of FIG. 4, *1 is a case of BPSK and *¼ is a case of 8 PSK where ¼ is multiplied to estimate a channel reliability value. Also, *½ is a simulated value obtained by applying a value between 1 and ¼.

From FIG. 4, it can be seen that a bit error rate (BER) with respect to a symbol error to noise ratio (Es/No) is decreased remarkably in the case of *4.

FIGS. 5A to 5C are graphs describing bit error rate (BER) according to noise estimation error ($x=\sigma^*/\sigma$) at a ratio of bit error to noise (Eb/No). It presents a bit error rate obtained through 30 times iteration of decoding with respect to an encoder (N=192 and R=½). Here, when it is defined that $\sigma$ is a standard deviation of channel noise and $\sigma^*$ is a standard deviation including an assessed error, it means that $\sigma^*$ includes a noise assessed error as much as x ($\sigma^*=x\times\sigma$).

From FIGS. 5A to 5C, it can be seen that performance is degraded if $\sigma^*$ is assessed out of the range of [0.8$\sigma$ to 1.15$\sigma$].

Therefore, when the channel reliability value ($L_c=2/\sigma^2$) is estimated with a discrete channel reliability value ($\sigma^*$) at least the $\sigma^*$ should be within the range of [0.8$\sigma$ to 1.15$\sigma$]. Also, $\sigma^*$ the need to be maintained a little smaller than an actual $\sigma$.

However, since the channel reliability value ($L_c$) should be made discrete into a quantized value, e.g., {1,2,4}, an error occurs due to the difference between the actual channel reliability value ($L_c$) and the discrete channel reliability value ($L_c^*$).

To take two conspicuous examples, when the bit error-to-noise ratio (Eb/No) is 1.8 [dB], the channel reliability value ($L_c$) is 3.03 ($\sigma$0.812). If any one of {1,2,4} is taken as a discrete value, the discrete channel reliability value ($L_c^*$) is 4 ($\sigma^*$=0.707). When the error caused here is converted into noise assessed error, $\sigma^*$=0.87×$\sigma$. In this case, there is no degradation in performance.

Meanwhile, when the bit error-to-noise ratio (Eb/No) is 1.7 [dB], the channel reliability value ($L_c$) is 2.965 ($\sigma$=0.821). If any one of {1,2,4} is taken as a discrete value, the discrete channel reliability value ($L_c^*$) is 2 ($\sigma^*$=1). When the error caused here is converted into noise assessed error, $\sigma^*$=1.22×$\sigma$. In this case, degradation in performance may be caused as expected from FIGS. 5A to 5C.

In the conventional LDPC decoding system, the pre-process is not performed in detail as described above and the change in performance with respect to noise assessed error is neglected. Therefore, the conventional system has a problem that performance can be degraded according to how it is embodied and that the system is very complicated in the respect of hardware.

SUMMARY OF THE INVENTION

It is, therefore, an object of the present invention to provide a pre-processing apparatus using nonuniform quantization of a channel reliability value, the apparatus that can present degradation in performance and be embodied simply in the respect of hardware by performing pre-process, and a low density parity check (LDPC) decoding system. The pre-process is performed by estimating a discrete channel reliability value ($L_c^*$) through nonuniform quantization of a channel reliability value based on a relations between a bit error rate (BER) estimated through a simulation performed in advance and a standard deviation ($\sigma$) of channel noise within a predetermined range of noise estimation error and p, and bit-shifting a receiving signal as much as a discrete channel reliability value.

Other objects and advantages can be understood in the following detailed description with the help of the embodiments of the present invention. Also, it can be seen easily that the objects and advantages of the present invention can be embodied by the means mentioned in claims and a combination thereof.

In accordance with an aspect of the present invention, there is provided a pre-decoding apparatus using nonuniform quantization of a channel reliability value, including: a channel reliability measuring unit for estimating a discrete channel reliability value within a predetermined range based on a result of performance simulation with respect to a bit error rate (BER) according to a standard deviation of channel noise; a nonuniform quantizing unit for nonuniformly quantizing a channel reliability value of a signal transmitted from the outside into the discrete channel reliability value estimated in the channel reliability measuring means; a sign bit adding unit for adding a sign bit to the signal transmitted from the outside to thereby output a signal having the sign bit; and a bit shifting unit for bit-shifting the signal having the sign bit which is obtained in the sign bit adding unit as much as the discrete channel reliability value obtained in the nonuniform quantizing means.

In accordance with another aspect of the present invention, there is provided a Low Density Parity Check (LDPC) decoding system using nonuniform quantization of a channel reliability value, including: a pre-processing unit for estimating a discrete channel reliability value within a predetermined range based on a performance simulation result with respect to a bit error rate (BER) according to standard deviation of channel noise, quantizing nonuniformly the channel reliability value of a signal transmitted from the outside into the above estimated discrete channel reliability value, and bit-shifting the receiving signal as much as the quantized discrete channel reliability value; an initializing unit for initializing the LDPE decoding system based on data transmitted from the pre-processing means; a probability calculation iterating unit for receiving data from the initializing means, calculating the relationship between parity nodes and bit nodes in a form of a probability, and updating a result obtained from the probability calculation; and a Log Likelihood Ratio (LLR) calculating unit for restoring encoded data by using the data outputted from the probability calculation iterating means.

BRIEF DESCRIPTION OF THE DRAWINGS

The above and other objects and features of the present invention will become apparent from the following description of the preferred embodiments given in conjunction with the accompanying drawings, in which:

FIG. 6 is a table presenting a discrete channel reliability value ($L_c^*$) based on a channel reliability value ($L_c$) for nonuniform quantization in a pre-process apparatus for nonuniform quantization of a channel reliability value in accordance with an embodiment of the present invention;

FIG. 7 is a block diagram illustrating a pre-processing apparatus for nonuniform quantization of a channel reliability value in accordance with an embodiment of the present invention;

FIG. 8A is a diagram describing a low density parity check pre-processing system using nonuniform quantization of a channel reliability value in accordance with an embodiment of the present invention;

FIG. 10 is a diagram showing a discrete channel reliability value based on an encoding rate in a low density parity check decoding system using nonuniform quantization of a channel reliability value in accordance with an embodiment of the present invention.

DETAILED DESCRIPTION OF THE INVENTION

Other objects and aspects of the invention will become apparent from the following description of the embodiments with reference to the accompanying drawings, which is set forth hereinafter. Also, in the description of the present invention, if it is found that a specific description on a prior art related to the present invention may blur the point of the present invention, the description will be omitted.

Figure 1:
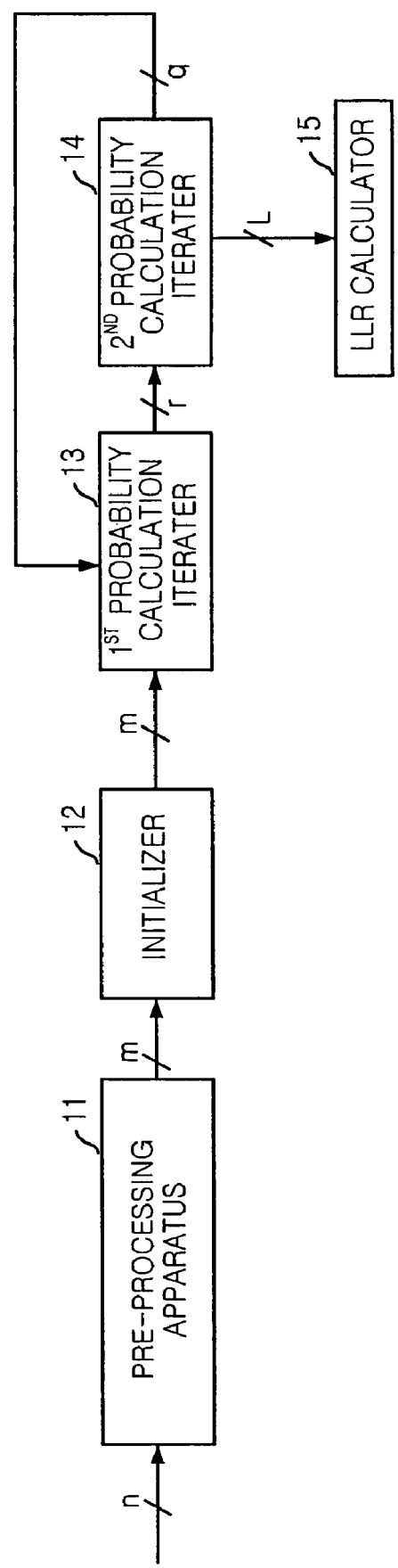
FIG. 1 is a block diagram showing a low density parity check decoding system using nonuniform quantization of a channel reliability value in accordance with an embodiment of the present invention.
Figure 2:
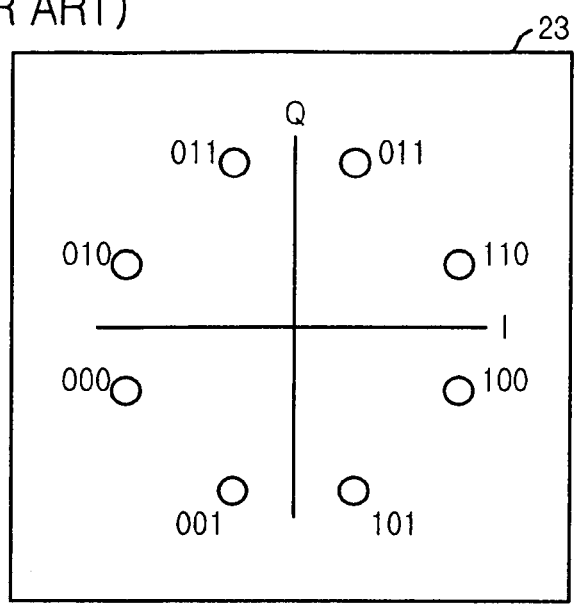
FIG. 2 is a diagram describing a least significant bit (LSB) allocating method in 8 Phase Shift Keying (PSK) in accordance with an embodiment of the present invention.
Figure 3:
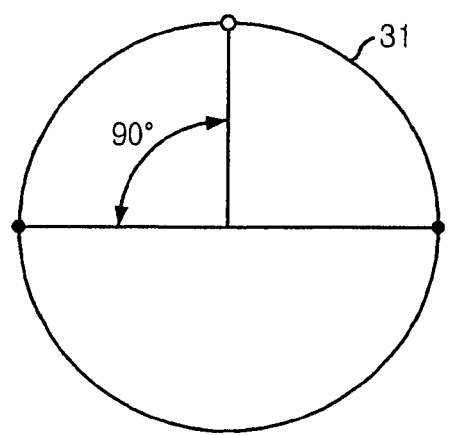
FIG. 3 is a diagram showing a difference in determination range according to a modulation method.
Figure 3:
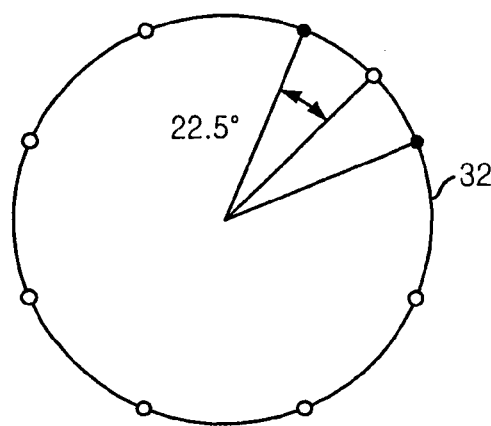
Figure 4:
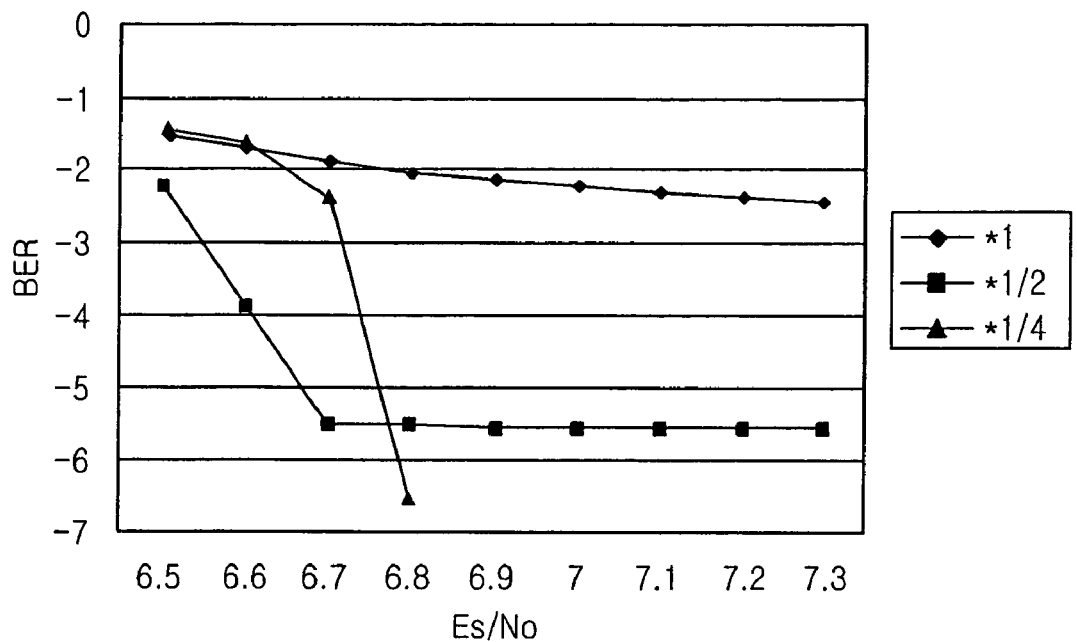
FIG. 4 is a graph illustrating performance in estimating a channel reliability value based on Equation 1.
Figure 5A:
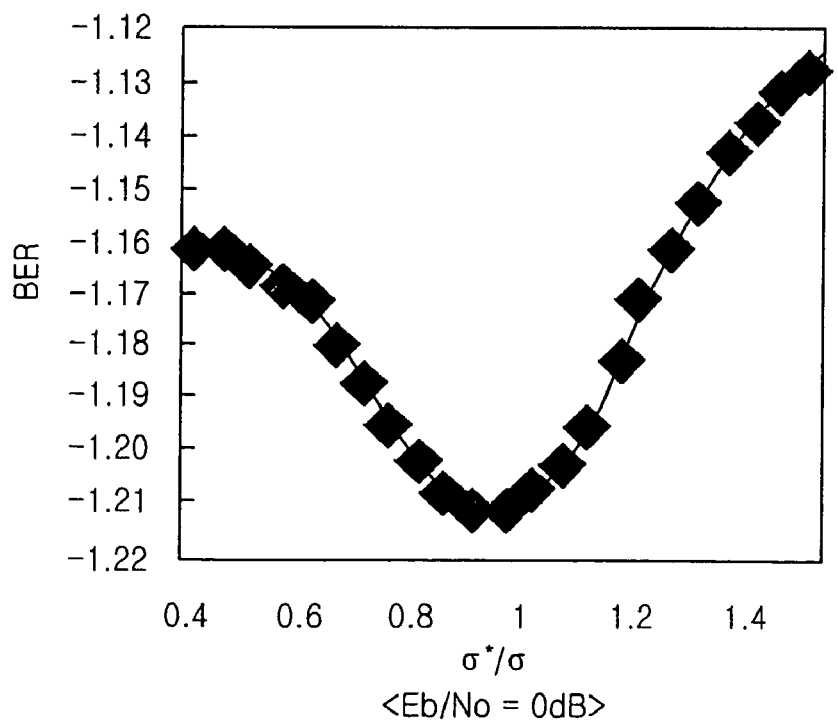
FIGS. 5A to 5C are graphs describing bit error rate (BER) according to noise estimation error ($x = \sigma^*/\sigma$) at a ratio of bit error to noise (Eb/No)
Figure 5B:
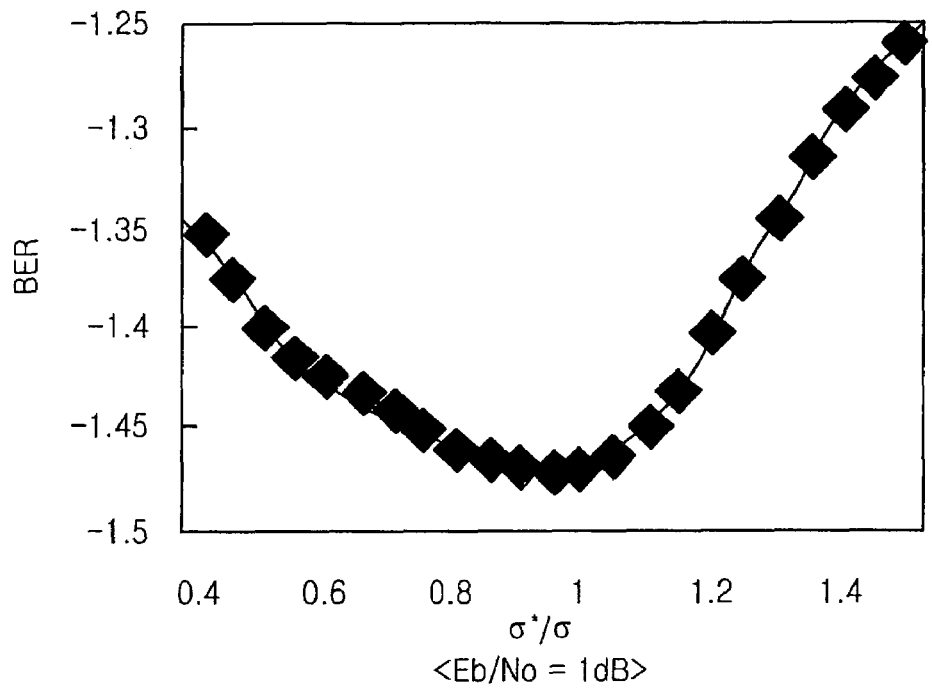
Figure 5C:
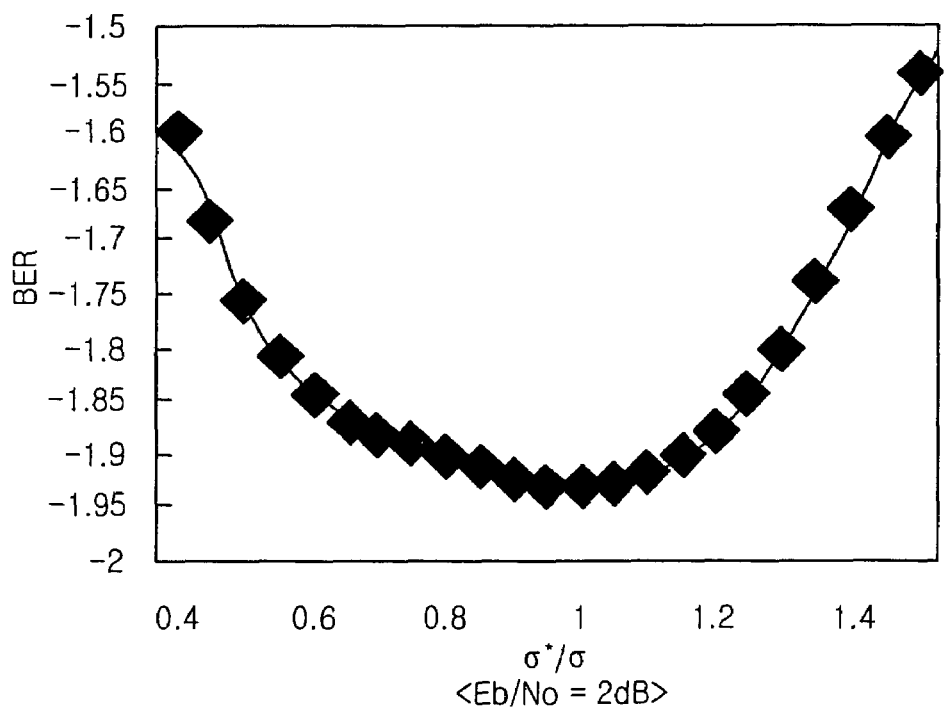

FIG. 1 is a block diagram showing a low density parity check decoding system using nonuniform quantization of a channel reliability value in accordance with an embodiment of the present invention.

The Low Density Parity Check (LDPC) decoding system using nonuniform quantization of a channel reliability value in accordance with the present invention includes: a pre-processing apparatus 11, an initializer 12, a first probability calculation iterater 13, a second probability calculation iterater 14, and a Log Likelihood Ratio (LLR) calculator.

The pre-processing apparatus 11 estimates a discrete channel reliability value within a predetermined range based on the performance simulation result with respect to a bit error rate (BER) according to standard deviation of channel noise, quantizes nonuniformly the channel reliability value of a signal transmitted from the outside into the above estimated discrete channel reliability value, and shifts the receiving signal as much as the quantized discrete channel reliability value.

The initializer 12 initializes the LDPE decoding system based on data transmitted from the pre-processing apparatus 11.

The first probability calculation iterater 13 receives data from the initializer 12 and the second probability calculation iterater 14, calculates the relationship between parity nodes and updates the result.

The second probability calculation iterater 14 receives data from the first probability calculation iterater 13, calculates the relationship between bit nodes and updates the result.

The LLR calculator 15 restores encoded data by using the data outputted from the second probability calculation iterater 14.

FIG. 6 is a table presenting a discrete channel reliability value ($L_c^*$) based on a channel reliability value ($L_c$) for nonuniform quantization in a pre-process apparatus for nonuniform quantization of a channel reliability value in accordance with an embodiment of the present invention. In the table, σ 61 denotes a standard deviation of channel noise established to be allocated to a channel reliability value ($L_c$); σ* 62 denotes a standard deviation including a noise assessed error (x); x 63 denotes a noise assessed error; $L_c$ 64 denotes a channel reliability value; and $L_c^*$ 65 denotes a discrete channel reliability value.

If any one of {1,2,4} is selected as a discrete channel reliability value with respect to the channel reliability value ($L_c$), multiplication operation can be replaced by bit-shifting as expressed in Equation 2.

$$L_f = -L_c \times r_k \qquad \text{Eq. 2}$$

$$\approx C[r_k] \ll L_c^*$$

wherein C[ ] denotes a function taking a complement of 2; and $r_k$ is a binary number.

If the channel reliability value ($L_c$) is made discrete to apply bit shifting method, it is desirable to perform nonuniform quantization as shown in FIG. 6.

FIG. 7 is a block diagram illustrating a pre-processing apparatus for nonuniform quantization of a channel reliability value in accordance with an embodiment of the present invention.

As shown in FIG. 7, the pre-processing apparatus using nonuniform quantization of a channel reliability value includes: a channel reliability estimator 71, a nonuniform quantizing unit 72, a sign bit adder 73, and a bit shifter 74.

The channel reliability estimator 71 estimates a discrete channel reliability value within a predetermined range based on performance simulation result with respect to a bit error rate according to standard deviation of channel noise.

The nonuniform quantizing unit 72 nonuniformly quantizes a channel reliability value of a signal transmitted from the outside into a discrete channel reliability value estimated in the channel reliability estimator 71.

The sign bit adder 73 adds a sign bit to the receiving signal from the outside. The bit shifter 74 receives a receiving signal obtained by adding the sign bit to the receiving signal from the outside and the discrete channel reliability value obtained from the nonuniform quantization of the nonuniform quantizing unit 72 and perform bit-shifting on the receiving signal with the sign bit as much as the nonuniformly-quantizaed discrete channel reliability value.

FIG. 8A is a diagram describing a low density parity check pre-processing system using nonuniform quantization of a channel reliability value in accordance with an embodiment of the present invention.

In this embodiment, the discrete channel reliability value is assumed to be 4 and bit-shifted by two bits. When an input signal $r_k$ is inputted to the LDPC decoding system (see 81 of FIG. 8A), three bits of Most Significant Bit (MSB) of an 8-bit memory where the result of $-L_c r_k$ operation is to be stored are filled with a sign bit of $r_k$ (see 82 of FIG. 8A). Then, 0, 1 or 2 bit is shifted based on the discrete channel reliability value (see 82 of FIG. 8A). In the drawing, the bit-shifting is performed by two bits. The result of $-L_c r_k$ operation can be obtained by obtaining a 2's complement with respect to the bit-shifting result.

Figure 8B:
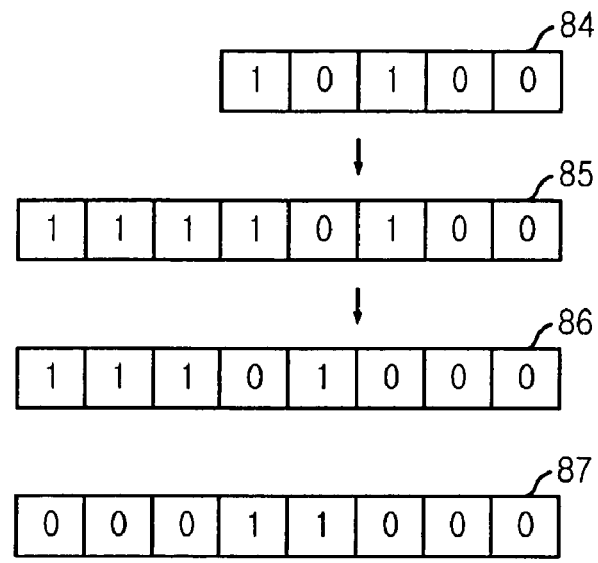
FIG. 8B is a diagram describing a low density parity check pre-processing system using nonuniform quantization of a channel reliability value in accordance with another embodiment of the present invention.

FIG. 8B is a diagram describing a low density parity check pre-processing system using nonuniform quantization of a channel reliability value in accordance with another embodiment of the present invention.

To take an example, if a discrete channel reliability value is 2 and a quantization value of $r_k$ is −12, an operation of $-L_c r_k$ is processed as follows.

When a channel reliability value is 2 and a quantization value of $r_k$ is −12 (see 84 of FIG. 8B), three bits of sign bits are added (see 85 of FIG. 8B). Then, they are shifted by one bit (see 86 of FIG. 8B) and the operation result (see 87 of FIG. 8B) of $-L_c r_k$, that is, −24, is outputted by calculating a 2's component.

Figure 9:
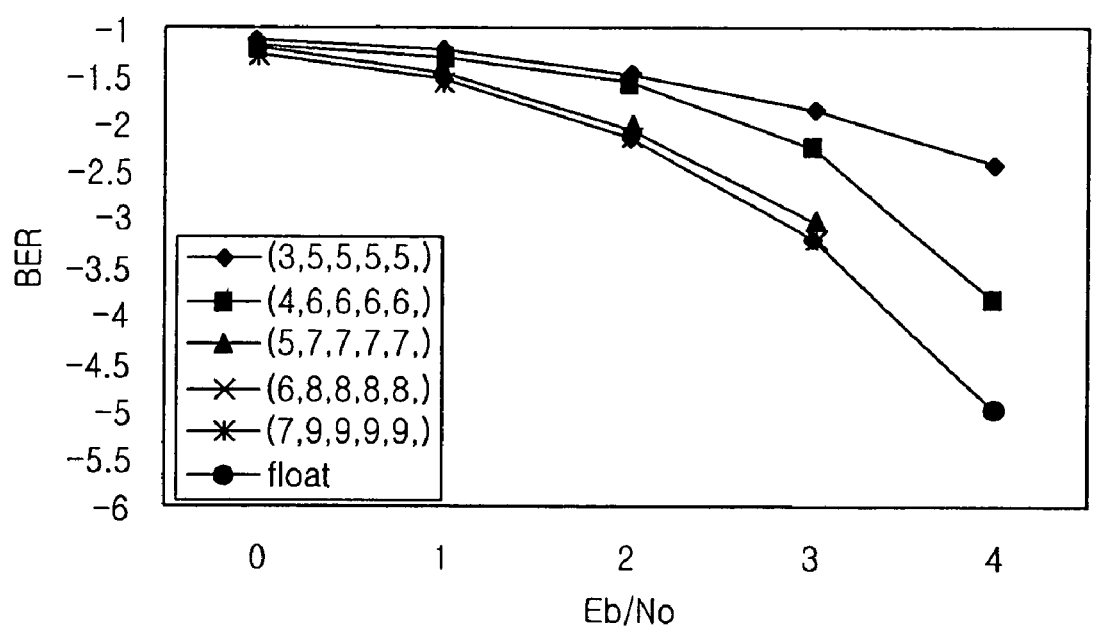
FIG. 9 is a graph presenting bit error rate (BER) based on the number of quantization bits of a channel reliability value in a low density parity check decoding system using nonuniform quantization of a channel reliability value in accordance with another embodiment of the present invention.

FIG. 9 is a graph presenting bit error rate (BER) based on the number of quantization bits of a channel reliability value in a low density parity check decoding system using nonuniform quantization of a channel reliability value in accordance with another embodiment of the present invention.

If an n-bit input signal is inputted to the pre-processing apparatus 11, m bits are outputted. Subsequently, m bits are inputted to the initializer 12 and initialized. Then, the m bits are inputted to the first probability calculation iterater 13 to thereby output r bits.

Then, the r bits are inputted into the second probability calculation iterater 14 to thereby output q bits. The q bits are inputted to the first probability calculation iterater 13 and iterated as many times as a predetermined number. Subsequently, the iteration loop is terminated and L bits are outputted to the LLR calculator 15 to calculate LLR, when q bits are outputted from the second probability calculation iterater 14.

This can be expressed as (n,m,r,q,L), i.e., (3,5,5,5,5), (4,6,6,6,6), (5,7,7,7,7), (6,8,8,8,8) and (7,9,9,9,9). FIG. 9 presents a bit error rate (BER) based on the number of quantized bits.

FIG. 10 is a diagram showing a discrete channel reliability value based on an encoding rate in a low density parity check decoding system using nonuniform quantization of a channel reliability value in accordance with an embodiment of the present invention.

The encoding rate 101 of a channel code is 'the number of input bits (information data)/the number of output bits (information data_parity bit)' in the encoder. The discrete channel reliability value 102 based on the encoding rate 101 is as shown in FIG. 10.

Figure 11:
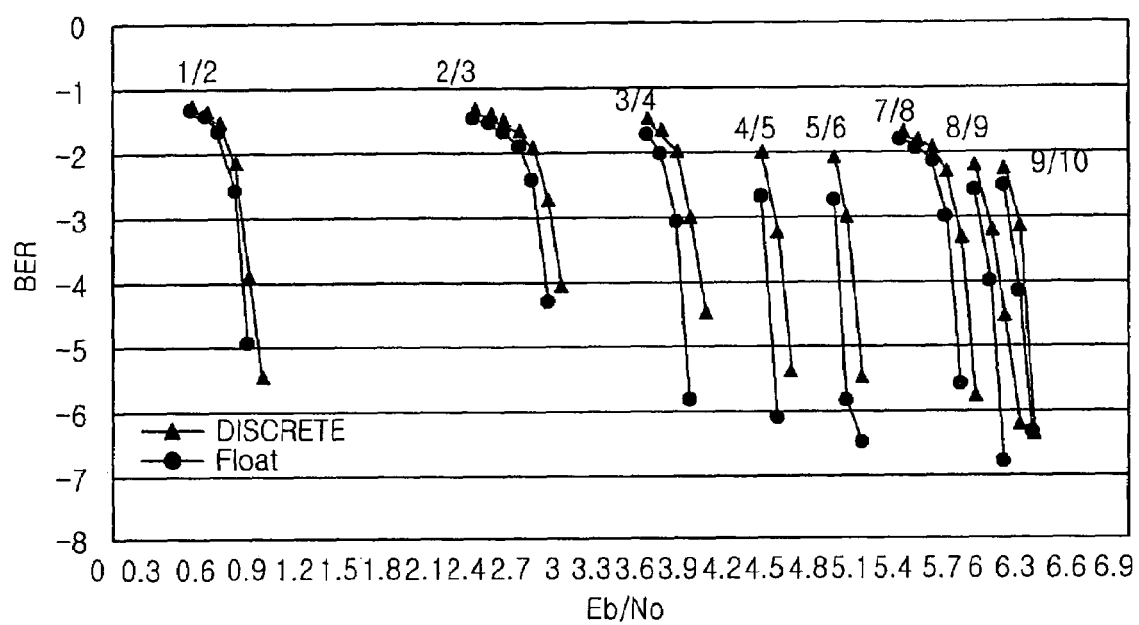
FIG. 11 is a graph presenting a bit error rate based on the discrete channel reliability value ($L_c^*$) of FIG. 10 in a low density parity check decoding system using nonuniform quantization of a channel reliability value in accordance with an embodiment of the present invention.

FIG. 11 is a graph presenting a bit error rate based on the discrete channel reliability value ($L_c^*$) of FIG. 10 in a low density parity check decoding system using nonuniform quantization of a channel reliability value in accordance with an embodiment of the present invention. In this simulation, the number of quantized bits is set to 8 bits and a discrete channel reliability value is the discrete channel reliability value 102 in each encoding rate 101 of FIG. 10.

FIG. 11 presents a bit error rate with respect to bit error-to-noise ratio (Eb/No) in discrete channel reliability values, which are marked as "●", and actual channel reliability values, i.e., float, which are marked as "▲". From FIG. 11, it can be seen that the discrete channel reliability values and the actual channel reliability values show similar bit error rates.

The present invention provides a pre-processing apparatus using nonuniform quantization of a channel reliability value, the apparatus that can present degradation in performance and be embodied simply by performing decoding pre-process, and a low density parity check (LDPC) decoding system.

While the present invention has been described with respect to certain preferred embodiments, it will be apparent to those skilled in the art that various changes and modifications may be made without departing from the scope of the invention as defined in the following claims.

What is claimed is:

1. A pre-decoding apparatus using nonuniform quantization of a channel reliability value, comprising:

a channel reliability measuring means for estimating a discrete channel reliability value within a predetermined range based on a result of performance simulation with respect to a bit error rate (BER) according to a standard deviation of channel noise;

a nonuniform quantizing means for nonuniformly quantizing a channel reliability value of a signal transmitted from the outside into the discrete channel reliability value estimated in the channel reliability measuring means;

a sign bit adding means for adding a sign bit to the signal transmitted from the outside to thereby output a signal having the sign bit; and a bit shifting means for bit-shifting the signal having the sign bit which is obtained in the sign bit adding means as much as the discrete channel reliability value obtained in the nonuniform quantizing means.

2. The apparatus as recited in claim 1, wherein a standard deviation ($\sigma$) including noise assessed error is within a range of [0.8 $\sigma$ to 1.15 $\sigma$] and maintained smaller than a standard deviation ($\sigma$) of channel noise, when a discrete channel reliability value based on a channel reliability value ($L_c=2/\sigma^2$) is estimated.

3. The apparatus as recited in claim 1, wherein the bit shifting means bit-shifts the signal having the sign bit added thereto by as much as the discrete channel reliability value which is obtained from nonuniform quantization in the nonuniform quantizing means, wherein the discrete channel reliability value is a power of 2.

4. A Low Density Parity Check (LDPC) decoding system using nonuniform quantization of a channel reliability value, comprising:

a pre-processing means for estimating a discrete channel reliability value within a predetermined range based on a performance simulation result with respect to a bit error rate (BER) according to standard deviation of channel noise, quantizing nonuniformly the channel reliability value of a signal transmitted from the outside into the above estimated discrete channel reliability value, and bit-shifting the receiving signal as much as the quantized discrete channel reliability value;

an initializing means for initializing the LDPE decoding system based on data transmitted from the pre-processing means;

a probability calculation iterating means for receiving data from the initializing means, calculating the relationship between parity nodes and bit nodes in a form of a probability, and updating a result obtained from the probability calculation; and a Log Likelihood Ratio (LLR) calculating means for restoring encoded data by using the data outputted from the probability calculation iterating means.

* * * * *